United States Patent
Munks et al.

(10) Patent No.: US 6,353,623 B1
(45) Date of Patent: Mar. 5, 2002

(54) TEMPERATURE-CORRECTED WAVELENGTH MONITORING AND CONTROL APPARATUS

(75) Inventors: Timothy C. Munks, Crystal Lake, IL (US); Paul E. Dunn, Westfield, MA (US); David J. Allie, Storrs, CT (US)

(73) Assignee: Uniphase Telecommunications Products, Inc., Bloomfield, CT (US)

( * ) Notice: Subject to any disclaimer, the term of this patent is extended or adjusted under 35 U.S.C. 154(b) by 0 days.

(21) Appl. No.: 09/224,960

(22) Filed: Jan. 4, 1999

(51) Int. Cl.$^7$ ............................................. H01S 3/10
(52) U.S. Cl. ................. 372/20; 372/29.02; 372/29.011; 372/32; 372/38.01; 372/38.07
(58) Field of Search ...................... 372/38.01, 38.07, 372/20, 29.011, 29.02, 32

(56) References Cited

U.S. PATENT DOCUMENTS

| | | | | |
|---|---|---|---|---|
| 5,033,114 A | * | 7/1991 | Jayaraman | 455/618 |
| 5,299,212 A | * | 3/1994 | Koch | 372/32 |
| 5,345,455 A | * | 9/1994 | Gabriagues | 372/20 |
| 5,696,859 A | * | 12/1997 | Onaka | 385/24 |
| 5,812,572 A | * | 9/1998 | King | 372/38 |
| 6,094,446 A | * | 7/2000 | Tei | 372/32 |
| 6,122,301 A | * | 9/2000 | Tei | 372/32 |
| 6,134,253 A | * | 10/2000 | Munks | 372/38 |

\* cited by examiner

Primary Examiner—James W. Davie
Assistant Examiner—Gioacchino Inzirillo
(74) Attorney, Agent, or Firm—McCormick, Paulding & Huber LLP

(57) ABSTRACT

Apparatus and methods for monitoring the wavelength of laser radiation and that provide a temperature-corrected error signal responsive to the deviation of the wavelength of the laser radiation from a nominal wavelength is disclosed. The apparatus includes a least one optical filter for filtering the laser radiation according to at least one spectral filter function to produce filtered laser radiation and at least one optical detector for detecting the filtered laser radiation to produce a first detected signal. The apparatus also includes a temperature sensor for sensing temperature characteristic of at least the optical filter and processing circuitry for providing a temperature-corrected output signal responsive to the deviation of the wavelength of the laser radiation from the nominal wavelength. The processing circuitry includes an error circuit for providing, responsive to at least the first detected signal, an uncorrected error signal responsive the deviation of the wavelength of the laser radiation from the nominal wavelength and a memory for providing offset values corresponding to selected temperatures. The processing circuitry, responsive to the temperature sensor, modifies the uncorrected signal based on at least one offset value to produce the temperature-corrected error signal. The laser wavelength monitoring apparatus can be advantageously combined with a laser and a laser wavelength control to provide a laser having a regulated or tunable wavelength.

25 Claims, 13 Drawing Sheets

| ADDRESS | TEMP. (HEX) | TEMP. (DEC) | OFFSET (HEX) | OFFSET (DEC) |
|---|---|---|---|---|
| 0 | 62 | -1 | 656 | -426 |
| 1 | 72 | 7 | 5DB | -549 |
| 2 | 7B | 11.5 | 5C9 | -567 |
| 3 | 84 | 16 | 5ED | -531 |
| 4 | 8D | 20.5 | 610 | -496 |
| 5 | 96 | 25 | 615 | -491 |
| 6 | 9F | 29.5 | 5EE | -530 |
| 7 | A7 | 33.5 | 5B2 | -590 |
| 8 | B0 | 38 | 566 | -666 |
| 9 | B9 | 42.5 | 549 | -695 |
| 10 | C2 | 47 | 548 | -696 |
| 11 | CB | 51.5 | 556 | -682 |
| 12 | D2 F | 55 | 55E | -674 |
| 13 | DA | 59 | 566 | -666 |
| 14 | DC | 60 | 545 | -699 |
| 15 | F9 | 74.5 | 473 | -909 |

TEMPERATURE-CORRECTED WAVELENGTH MONITORING AND CONTROL APPARATUS

CROSS REFERENCE TO RELATED APPLICATIONS

Some of the matter contained herein is disclosed and claimed in the following commonly owned U.S. patent applications: U.S. patent application Ser. No. 08/934,189, entitled "Integrated Wavelength-Select Transmitter"; a Continued Prosecution Application of the foregoing U.S. patent application and of the same title, U.S. patent application Ser. No. 09/025,987, entitled "Method and Apparatus For Monitoring And Control Of Laser Emission Wavelength"; and a Continued Prosecution Application of the foregoing application, All of the foregoing patent applications are herein incorporated by reference.

BACKGROUND OF THE INVENTION

In a typical optical communication system, an optical transmitter generates an optical beam and modulates the beam with an electrical signal representative of the information to be transmitted by the communication system. An optical fiber propagates the modulated optical signal to a receiver that demodulates the optical beam to recover the electrical signal. Fiber amplifiers, disposed at appropriate intervals in the fiber optic link between the transmitter and the receiver, maintain the strength of the optical signals. The low loss, light weight, small size, flexibility and high intrinsic bandwidth of optical fiber make optical communication systems highly desirable for the communication of both of digital and analog signals. The many applications of optical communication systems include cable TV (CATV) systems, telephone and other cross-country or cross-continent communication systems, and microwave and RF, such as phased array antenna systems used by the military, where the optical communication system can replace the complex and bulky down converters and up converters typically located at the front end of the microwave or RF antennas.

One important concern with optical communication systems, and in particular in systems that employ Dense Wavelength Division Multiplexing (DWDM) techniques to increase information carrying capacity, is the monitoring and control of the wavelength of the laser source. The wavelength of a typical laser source is known to be affected by several factors, such as laser source current, laser temperature, and aging of the laser, all leading to variations in the laser wavelength, which can affect the performance of other system components and affect overall system performance. For example, in a DWDM system, multiple beams, each of a different wavelength and representing a distinct channel for the transmission of data, are combined (multiplexed) to propagate as a beam along a single optical fiber. In an DWDM system, the wavelength stability of the laser sources limits number of channels—the channels cannot be so closely spaced such that the wavelength of one channel laser source drifts too close to the wavelength at which another channel light source is operating. Information will be lost. Accordingly, the better the regulation of the wavelength of the laser sources, the more densely the channels can be packed within a particular wavelength range.

One method for regulating the wavelength of the laser is to regulate the temperature of the laser. For example, Distributed Feedback (DFB) lasers are typically temperature stabilized using a thermal control loop consisting of a thermistor to sense the device temperature, an electronic feedback loop, and a thermoelectric cooler (TEC) that responsive to feedback adjusts the temperature of the laser. Thermal regulation is employed because it also protects the DFB laser from overheating, and helps to stabilize power output of the laser. However, laser drift is still a concern and limits the density of channels.

Known in the art are closed loop systems that monitor the actual wavelength of the laser and provide an error signal responsive to the deviation of the laser wavelength from a desired wavelength, and use the error signal to control the temperature or excitation current of laser as a means of controlling the laser wavelength. These systems can be an improvement over a system that just regulates the temperature of the laser. The error signal can control the temperature of the laser or the current supplied to the laser. However, the monitoring apparatus itself can also be sensitive to temperature changes, and compensation is best made for this temperature sensitivity. Unfortunately, currently practiced techniques for compensating for the temperature sensitively of the wavelength monitoring apparatus can be cumbersome to implement and/or produce less than satisfactory results. Improvement in such techniques can also lead better system performance via improved wavelength management and optimization.

Accordingly, it is an object of the invention to provide improved monitoring and/or control of laser wavelength, in particular by providing methods and apparatus for compensating for the effects of temperature variation of the wavelength monitoring apparatus.

Other objects of the invention will in part be apparent and in part appear hereinafter.

SUMMARY OF THE INVENTION

In one aspect, the invention provides an apparatus for monitoring the wavelength of laser radiation. The apparatus includes an optical filter for receiving at least a portion of the laser radiation and for transmitting a first filtered beam in accordance with a first spectral filter function and for reflecting a second filtered beam in accordance with a second spectral filter function. The spectral filter functions cross at least one crossing wavelength. Also included are: first and second optical detectors for receiving the first and second filtered beams, respectively, and for providing first and second detected signals; temperature sensor for sensing a temperature characteristic of at least the optical filter; and processing circuitry for providing a temperature-corrected error signal responsive to the deviation of the wavelength of the laser radiation from a nominal wavelength. The processing circuitry includes: an error circuit for providing, responsive to the first and second detected signals, an uncorrected error signal responsive to the deviation of the wavelength of the laser radiation from the nominal wavelength; and a memory for providing offset values corresponding to selected temperatures, and wherein the processing circuitry, responsive to the temperature sensor, modifies the uncorrected error signal based on at least one offset value to produce the temperature-corrected output signal.

The optical filter can mount the first and second optical detectors, and the processing circuitry can include a microcontroller chip that includes on the chip the memory and the error circuit, the memory including a PROM circuit. Furthermore, the microcontroller can be programmed such that the determination of the error signal by the error circuit includes determining a ratio of the difference between the detected signals to the sum of the detected signals, and also for performing self calibration for determining and storing the offset values in the memory. The self calibration includes, at selected temperatures, determining the deviation of the uncorrected error signal from a predetermined value and storing an offset responsive to the deviation and associating the stored offset with one of the selected temperatures.

In another aspect of the invention, apparatus for monitoring the wavelength of laser radiation includes at least one optical filter for filtering the laser radiation according to at least one spectral filter function to produce filtered laser radiation; at least one optical detector for detecting the filtered laser radiation to produce a first detected signal; a temperature sensor for sensing a temperature characteristic of at least the optical filter; and processing circuitry for providing a temperature-corrected output signal responsive to the deviation of the wavelength of the laser radiation from a nominal wavelength. The processing circuitry can include an error circuit for providing, responsive to at least the first detected signal, an uncorrected signal responsive the deviation of the wavelength of the laser radiation from the nominal wavelength; and a memory for providing offset values corresponding to selected temperatures, and wherein the processing circuitry, responsive to the temperature sensor, modifies the uncorrected signal based on at least one offset value to produce the temperature-corrected output signal.

In yet a further aspect, the invention includes a laser apparatus incorporating temperature-corrected wavelength monitoring apparatus, such as that described above. Also included is a laser and a laser wavelength control responsive to temperature-corrected error signals. The laser wavelength control can control the current or voltage supplied to the laser or the temperature of the laser. A thermoelectric cooler can be included for controlling the temperature of the laser.

Also provided according to the invention are methods for calibrating and operating a laser wavelength monitoring apparatus and laser apparatus incorporating such laser wavelength monitoring apparatus. The methods can be practiced in accordance with the disclosure herein.

The foregoing and other objects, advantages and features of the invention will be apparent from the following description and the accompanying drawings. The drawings illustrate principles of the invention, though not drawn to scale.

DETAILED DESCRIPTION OF THE PREFERRED EMBODIMENTS

Figure 1:
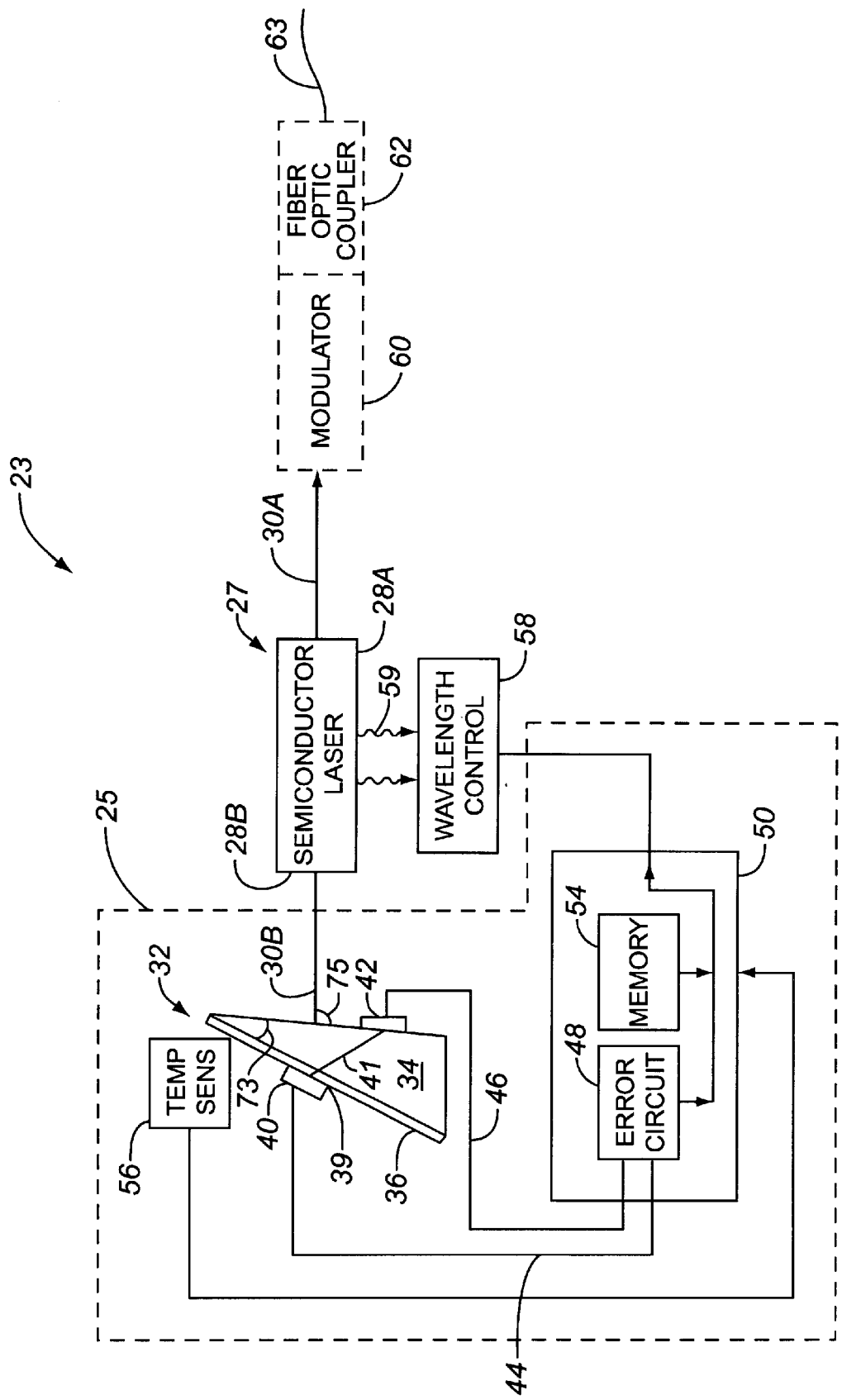
FIG. 1 illustrates an optical transmitter incorporating a preferred embodiment of a laser wavelength monitoring apparatus according to the invention.

FIG. 1 illustrates an optical transmitter 23 incorporating a preferred embodiment 25 of a laser wavelength monitoring apparatus according to the invention. Shown in FIG. 1 is a semiconductor laser 27 emanating laser radiation from front and rear facets, 28A and 28B respectively. The optical filter 32 is disposed for receiving the beam 30B for sampling the radiation of the laser 27 for monitoring of the wavelength thereof. The optical filter 32 can include a wedge shaped substrate 34 and a filter layer 36 disposed with the substrate 34. The optical filter 32 transmits a first filtered beam 39 to the optical detector 40 and reflects a second filtered beam 41 to the optical detector 42, according to first and second spectral filter functions, respectively, and the optical detectors 40 and 42 detect the filtered beams to produce first and second detected signals, respectively, used for comparing the intensities of the filtered beams. The spectral filter functions are selected to allow an error function responsive to the deviation of the wavelength of the laser from a selected nominal wavelength to be determined from the comparison of the filtered beams, and are discussed in more detail below.

Processing circuitry 50 includes an error circuit 52, which, responsive to the detected signals, produces an uncorrected error signal, which as noted above, is responsive to the deviation of the wavelength of the laser radiation from a nominal wavelength. The processing circuitry 50, responsive to the temperature as sensed by the temperature sensor 56, processes the uncorrected error signal and provides as an output a temperature-corrected error signal responsive to the deviation of the wavelength of the laser radiation from the nominal wavelength. The processing circuitry can include a look up table in a memory 54. The lookup table includes offset values to be added or subtracted from the uncorrected error signals for selected temperatures. If the temperature sensor 56 senses a temperature not exactly corresponding to a temperature for which an offset value is stored, the processing circuitry 50 can interpolate to find a suitable offset value. The temperature sensor is disposed for sensing a temperature characteristic of at least one component whose performance parameter vary with temperature so as to affect the error signal. "Characteristic of" means that the temperature is that of the component or is a temperature that can be related to that of the component of interest. In the embodiment of FIG. 1, the temperature sensor 56 is preferably disposed for sensing a temperature characteristic of the optical filter 32.

A laser wavelength control 58 can receive the temperature-corrected error signal from the processing circuitry 50 for regulating the wavelength of the laser 27, such as by controlling the excitation current provided to the laser 27, or by controlling the temperature of the laser 27 via control of a thermoelectric cooler (not shown) that is in thermal communication with the laser 27 and which selectively removes heat therefrom, as indicated by wavy lines 59. A modulator 60 and fiber optic coupler 62, having a fiber optic cable output 63, typically receive the output 30A of the laser 27. The fiber optical cable propagates a modulated signal for transmission to a receiver. (not shown) The laser 27, wavelength monitoring apparatus 25, wavelength control 58 and the modulator 60 and fiber optic coupler 62 can form the optical transmitter 23 of an optical communication system.

Figure 2A:
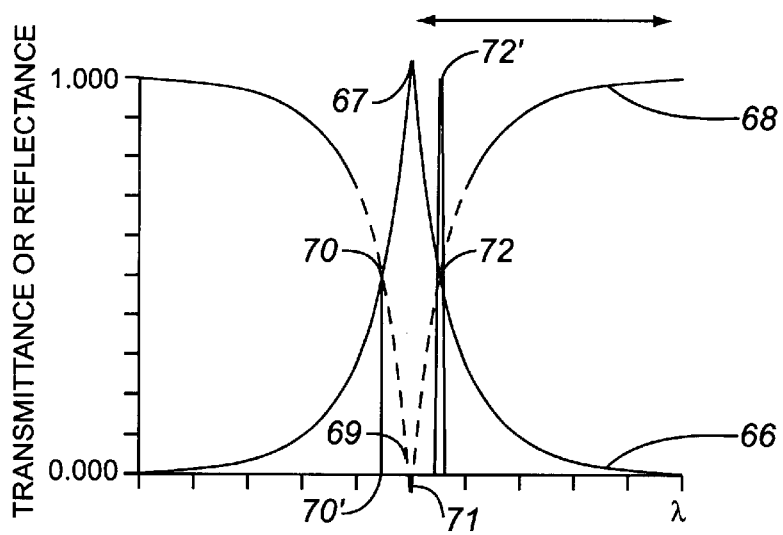
FIG. 2A illustrates the spectral filter functions according to which the optical filter of FIG. 1 transmits and reflects, respectively, the first and second filtered beams.

FIG. 2A illustrates the first and second spectral filter functions 66 (solid line) and 68 (broken line) corresponding to the first and second filtered beams, 39 and 41, respectively. In the embodiment of the invention shown in FIG. 1, the first and second spectral filter functions 66 and 68 are inversely related, the first spectral filter function having a resonant response 67 corresponding to a peak and the second spectral filter function having a resonant response 69 corresponding to a null. As understood by one of ordinary skill in the art, the wavelength at which the resonant responses 67 and 69 occur are equal, or typically very nearly equal, and for convenience are both represented in FIG. 2 by reference numeral 71. The first and second spectral filter functions cross at points 70 and 72, corresponding to first and second crossing wavelengths 70' and 72'. As understood by one of ordinary skill in the art, in light of the disclosure herein, the filter layer 36 can include multiple deposited film layers, each typically a quarter wavelength long at, or near, the desired operating wavelength of the laser. Furthermore, the substrate 32 need not have a wedge shape, though the wedge shape is considered preferable to reduce etalon effects.

One of the crossing wavelengths, such as that indicated by reference numeral 72', can correspond to the nominal wavelength. For example, at the wavelength of the laser 27, represented by the spectral line 75 in FIG. 2C, the first and second spectral filter functions, and hence the intensity of the first and second filtered beams, are equal. However, were the wavelength 75 of the laser 27 to shift to either side of the nominal wavelength 72', either the first spectral filter functions increases and the second spectral filter function decreases, or vice versa. Thus comparison of the first and second filtered beams, such as by subtracting or taking a ratio involving the first and second detected signals, can produce an error signal representative of the deviation of the wavelength of the laser 27 from the nominal wavelength corresponding to reference numeral 72'. Note that the first and second detected signal, or the error signal itself, can be modified to such that the error signal is responsive to the deviation of the wavelength of the laser 27 from a nominal wavelength not equal to a crossing point wavelength.

Figure 2B:
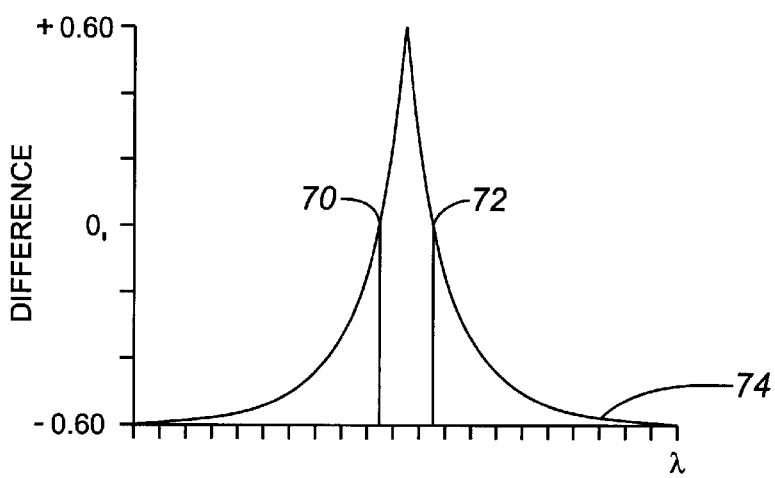
FIG. 2B illustrates the error signal obtained from the difference between the intensities of the reflected and transmitted filtered beams of FIG. 1.
Figure 2C:
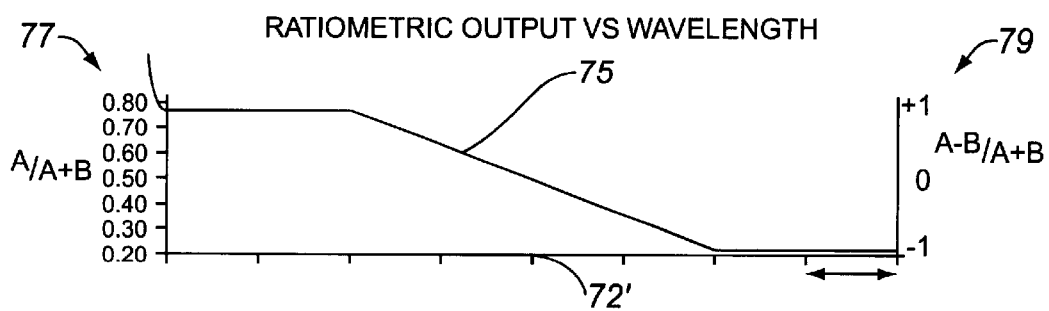
FIG. 2C illustrates the error signal obtained from taking a ratio involving the intensities of the reflected and transmitted filtered beams of FIG. 1.

As noted above, the techniques for deriving a useful error signal included subtracting the first and second detected signals, 44 and 46, and taking a ratio involving the signals. FIG. 2B illustrates the error signal obtained from the difference between the intensities of the reflected and transmitted beams of FIG. 1, typically derived by differencing the first and second detected signals. Reference numerals 70 and 72 correspond to the crossing point wavelengths 70' and 72', respectively. In FIG. 2C, the curve 75 illustrates the error signal from taking ratios involving the intensities of the filtered beams. The left hand vertical axis, indicated by reference numeral 77, indicates the numerical value for the ratio of one of the detected signals to the sum of the detected signals. The right hand vertical axis 79 corresponds to the error signal obtained by taking a ratio of the difference of the detected signals to the sum of thereof. The above examples are representative, and as understood by one of ordinary skill in light of the present disclosure, other ratios involving the intensities or phases of the filtered beams can be used to determine an error signal.

Varying the angle of incidence of the beam 30B on the optical filter, either by moving the filter 32 of by varying the wedge angle 73, "angle tunes" the filter, shifting both the first and second spectral filter functions along the horizontal wavelength axis in FIG. 2, varying the crossing point wavelengths 70' and 72' (as well as the peak and null resonant response wavelengths). Angle tuning is typically employed to shift the spectral filter function in wavelength so as to provide an appropriate error signal over a desired wavelength range including the nominal wavelength.

One of ordinary skill in the art, in light of the disclosure herein, understands that different types of optical filters can operate to provide a spectral filter function in different manners. For example, light energy can be absorbed, reflected, or transmitted by an optical filter. The energy not absorbed is either transmitted or reflected, or both. Accordingly, as used herein, the term "resonant response" can refer to a local or global maxima or minima (i.e., null) of a spectral filter function that correspond to a beam reflected or transmitted by a filter. Furthermore, as noted above, the optical filter 32 can include several film layers deposited on a substrate to form the filter layer 36. The optical filter can be one of other types of filters known in the art, such as filters formed from a grating disposed with a substrate, such as being etched on a surface of a substrate or other types of filters formed within a substrate, such as by selectively varying the index of refraction of the substrate. Other filters known in the art include Fabry-Perot etalon filters, fiber Bragg grating filters, and filters using a michelson interferometer.

The optical transmitter apparatus 23 shown in FIG. 1 and incorporating wavelength monitoring apparatus 25 and wavelength control 58 shown in FIG. 1 is considered to have several advantages. The transmitter is compact, and "in-line" and need not use a beamsplitter as compared with other embodiment described below. (However, the use of the optical filter 32 shown in FIG. 1 does not preclude the use of a beam splitter; for example, a beam splitter can be used to split the beam emanating from the front facet of the laser for sampling by the optical filter 32) Many of the components shown in FIG. 1 can be mounted within a common package and/or on a common substrate to form an optical transmitter module that is readily inserted and replaced in a DWDM communications transmitter. The components can be in thermal communication, such as by using a good thermal conductor as the substrate to which the components are mounted, for reducing drift due to temperature effects. The laser 27 can be a tunable semiconductor laser such as: a distributed Back Reflection (DBR) laser; a distributed feedback (DFB) laser; a super structure grating distributed back reflection (SSG-DBR) laser; and a grating assisted coupler with sampled rear reflector (GSCR) laser. Particularly useful is a laser that emanates a wavelength substantially equal to 980 nm and that is suitable as a pump laser for an erbium doped fiber amplifier, or a laser 27 that emanates radiation of a wavelength substantially equal to 1550 nm. Furthermore, the laser 27 can be a semiconductor laser tunable over a range of approximately 60 nm, where the range includes 1150 nm, allowing tunable operation over the complete bandwidth of a typical erbium-doped fiber amplifier. The operating wavelength of the laser 27 is selected by varying the nominal wavelength by biasing the error signal determined by the comparison of the filtered beams above, or by proper selection of the first and second spectral filter functions of the optical filter 32, or both. As an example of the latter, the optical filter 32 can be mechanically rotated to vary the angle of incidence of the beam 30B, thus varying the crossing point wavelengths 70' and 72', either of which can correspond to nominal wavelength. Thus, according to the invention there is provided a laser apparatus 525 that can provide radiation at the wavelength of any of a plurality of the channels of a DWDM system, and stabilizes the wavelength via monitoring the wavelength to provides the error signal, and provide the error signal to wavelength control 58.

Figure 3:
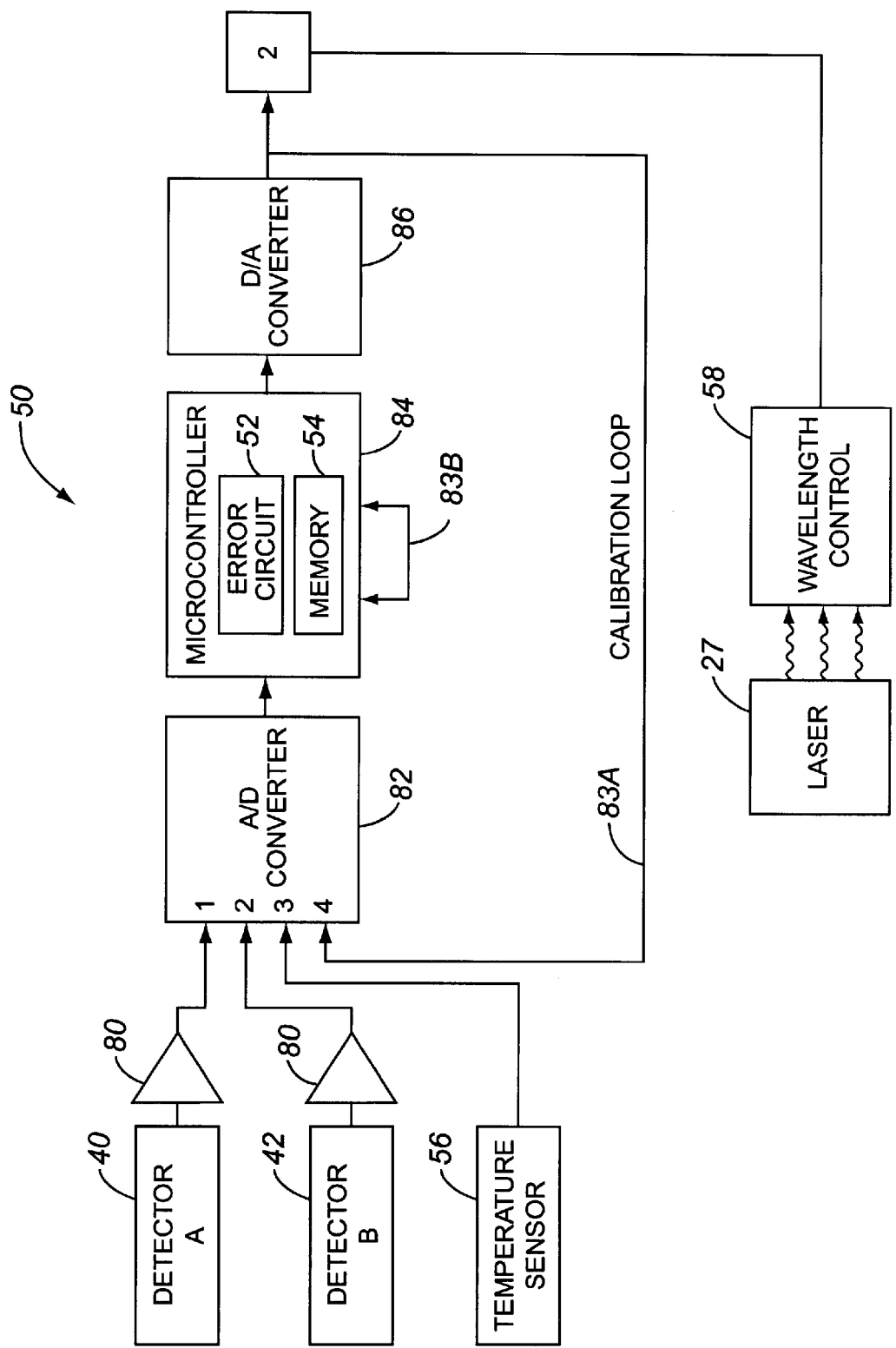
FIG. 3 is a block diagram of one example of the processing circuitry of FIG. 1.

FIG. 3 illustrates a general block diagram, described in additional detail in the ensuing FIGURES, of one example of processing circuitry 50 according to the invention. Gain blocks 80 amplify the detected signals from the optical detectors 40 and 42 prior to provision of the signals to the A/D converter 82. The four channel Analog to Digital (A/D) converter 82 is responsive to the first and second optical detectors 40 and 42, the temperature sensor 56, and includes a calibration input 83A, as described in more detail below, and converts analog inputs to a multiplexed digital output for provision to the microcontroller 84. The microcontroller 84 includes the memory 54, which in the illustrated circuit is a look up table, and error circuitry 52, which, as understood by one of ordinary skill in the art, in light of the disclosure herein, can be realized by appropriate programming of the microcontroller 84 to ratio the detected signals.

The microcontroller 84, for a given temperature sensed by the temperature sensor 56, determines the address corresponding to that temperature and retrieves the appropriate offset value, or interpolates as necessary to determine an appropriate offset value. The offset value is then applied to the uncorrected error signal to produce a temperature-corrected error signal. The output Digital to Analog Converter (D/A) 86 converts the temperature-corrected error signal received from the microcontroller to analog form, as can be suitable for provision to the wavelength control 58. If the temperature sensed by the temperature sensor 56 is not the temperature of the component of interest but is related thereto, the relationship is, as necessary, taken into account.

Figures 4A, 4B:
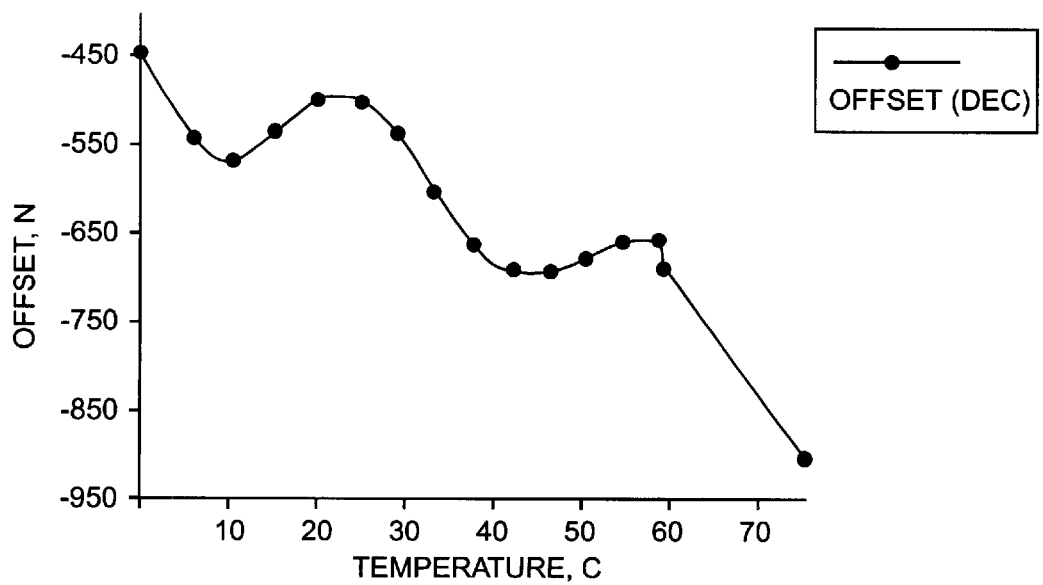
FIGS. 4A and 4B illustrate typical offset values stored in the look up table of the memory of the microcontroller of FIG. 3.

FIGS. 4A and 4B illustrate typical offset values stored in the look up table of memory 54. The temperatures and offset values are stored in hexadecimal form. Each temperature is associated with an address at which a corresponding offset is stored. FIG. 4B is a plot of the offset values versus temperatures shown in FIG. 4A. The offset value, when combined with the error signal, results in a temperature-corrected error signal that is zero or very nearly zero. Note that there is not an offset value of zero shown in FIGS. 4A and 4B. The wavelength monitoring apparatus is calibrated such that error signal is responsive to the deviation of the wavelength of the laser radiation from a nominal wavelength that does not correspond to a crossing point of the spectral filter functions.

Figure 5:
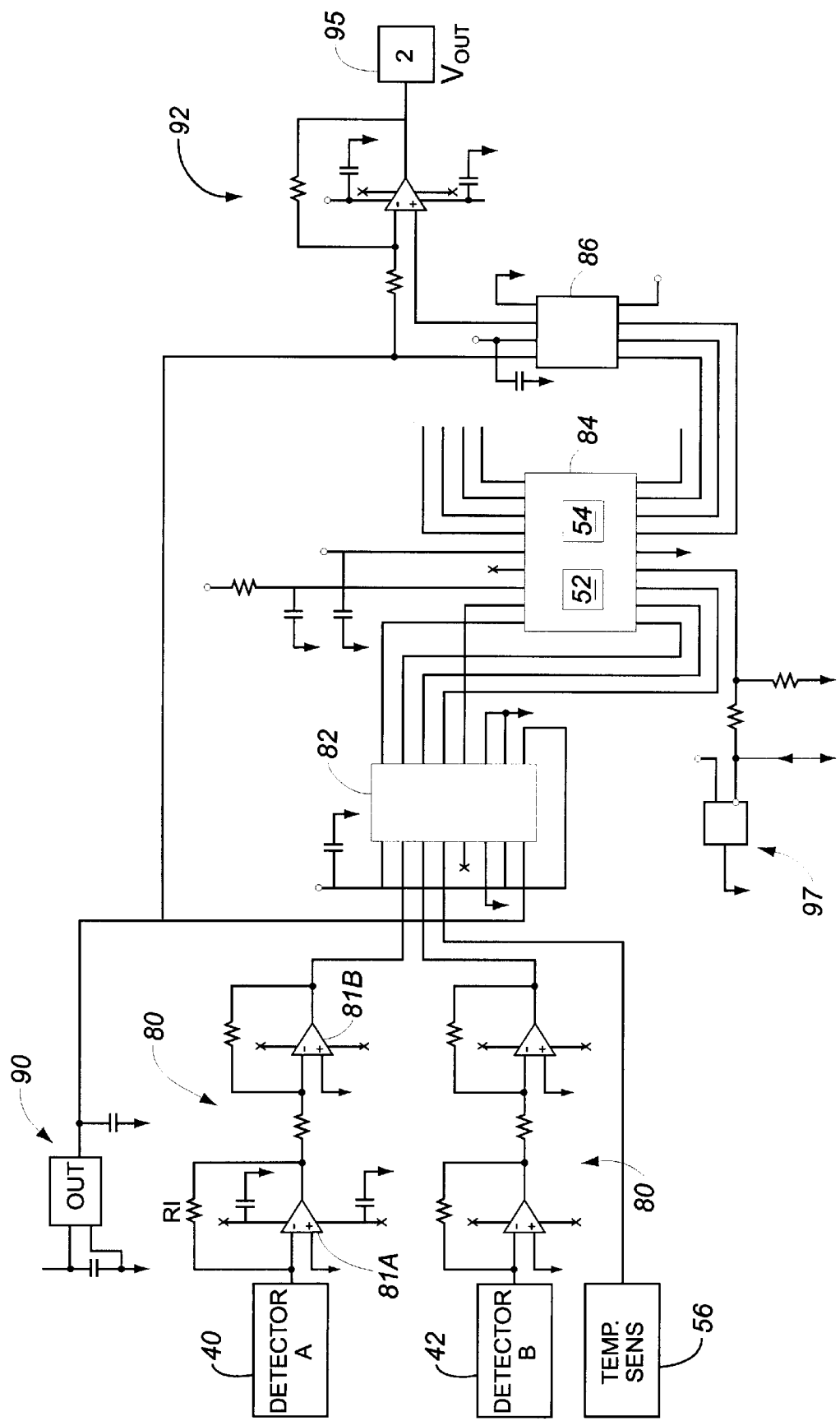
FIG. 5 is a circuit schematic of one example of processing circuitry according to the block diagram of FIG. 3.

FIG. 5 is a schematic of one example of processing circuitry that operates generally in accordance with the block diagram of FIG. 3. The operational amplifiers 80 operate the optical detectors 40 and 42 in an unbiased transimpedance mode. For example, with reference to the operational amplifier 81A, one terminal of the optical detector 40 is connected to the inverting input of the operational amplifier 81A, and the other terminal (not shown) is grounded, as is the non inverting input of the operational amplifier 81A. A resistor R1 couples the inverting input and the output of the operational amplifier 81. The second operational amplifier 81B simply inverts the polarity of the detected signal received from amplifier 81A.

The A/D converter 82 can be a Maxim model 1247; the microcontroller 84 can be a PIC model 16F84 which includes a memory 54 including an EEPROM memory for storing offset values; and the D/A converter 86 can be an Analog Devices model AD 7390. The microcontroller 84 can be programmed in PIC assembly language to function as the error circuit 52 and to store appropriate offset values corresponding to temperatures sensed by the sensor 56, and to apply those values to error signal to determine the temperature-corrected error signal. In the embodiment shown in FIG. 5, the microcontroller is programmed to determine the uncorrected error signal using the ratio of the difference between the detected signals to the sum thereof, as indicated by reference numeral 79 in FIG. 2C. Chip U1, indicated by reference numeral 90, is a stable voltage reference that provides a reference voltage to the A/D converter 82 and D/A converter 86 for use in the process of converting signals from digital to analog form and vice versa. The circuitry 92 converts the output from the D/A 86, which can range from zero to positive, to a signal that can be both negative and positive, provided as Vout, as indicated by reference numeral 95. Reference numeral 97 indicates a microcontroller reset circuit to shut down the system if the supply voltage drops too low, primarily for safeguarding against loss of calibration data.

Figure 6:
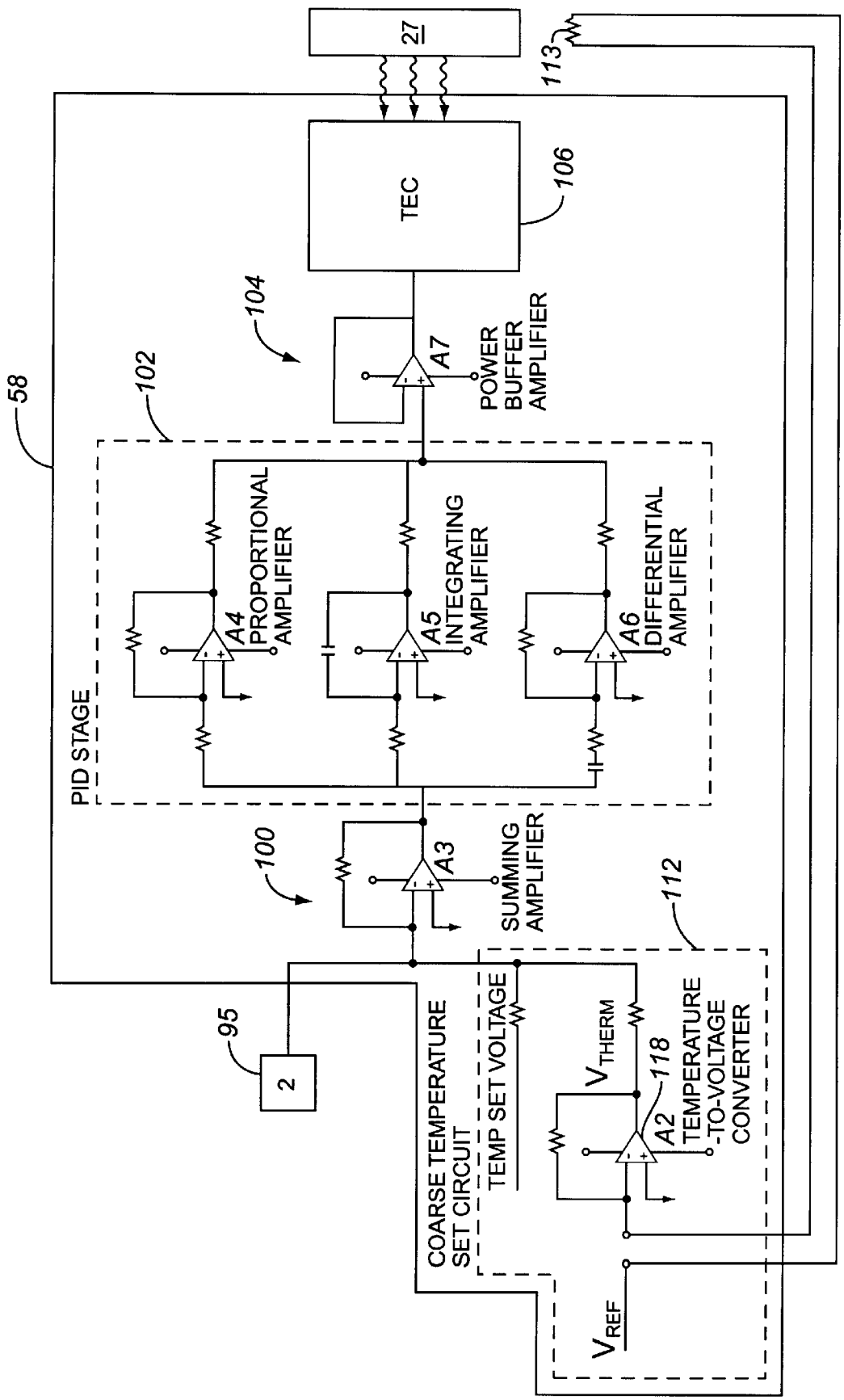
FIG. 6 illustrates one example of the laser wavelength control of FIG. 1.

FIG. 6 illustrates one example of a laser wavelength control 58, including an amplifier 100, a Proportional, Integrating and Differential (PID) control stage 102, a power buffer amplifier 104, and a thermo-electric cooler (TEC) 106 for selectively controlling the temperature of the laser 27 for controlling the wavelength of the laser radiation responsive to the temperature-corrected error signal. The wavelength control 58 can include a coarse temperature set circuit 112 for generally guiding the temperature of the laser to the proper operating range. The coarse temperature set circuit 112 includes a thermistor 113 that senses the temperature of the laser 27, and a temperature to voltage converter 118. The summing amplifier 100 sums the output of the coarse temperature set circuit with the temperature-corrected error signal 95 to generate an input to the PID stage 102.

Figure 7:
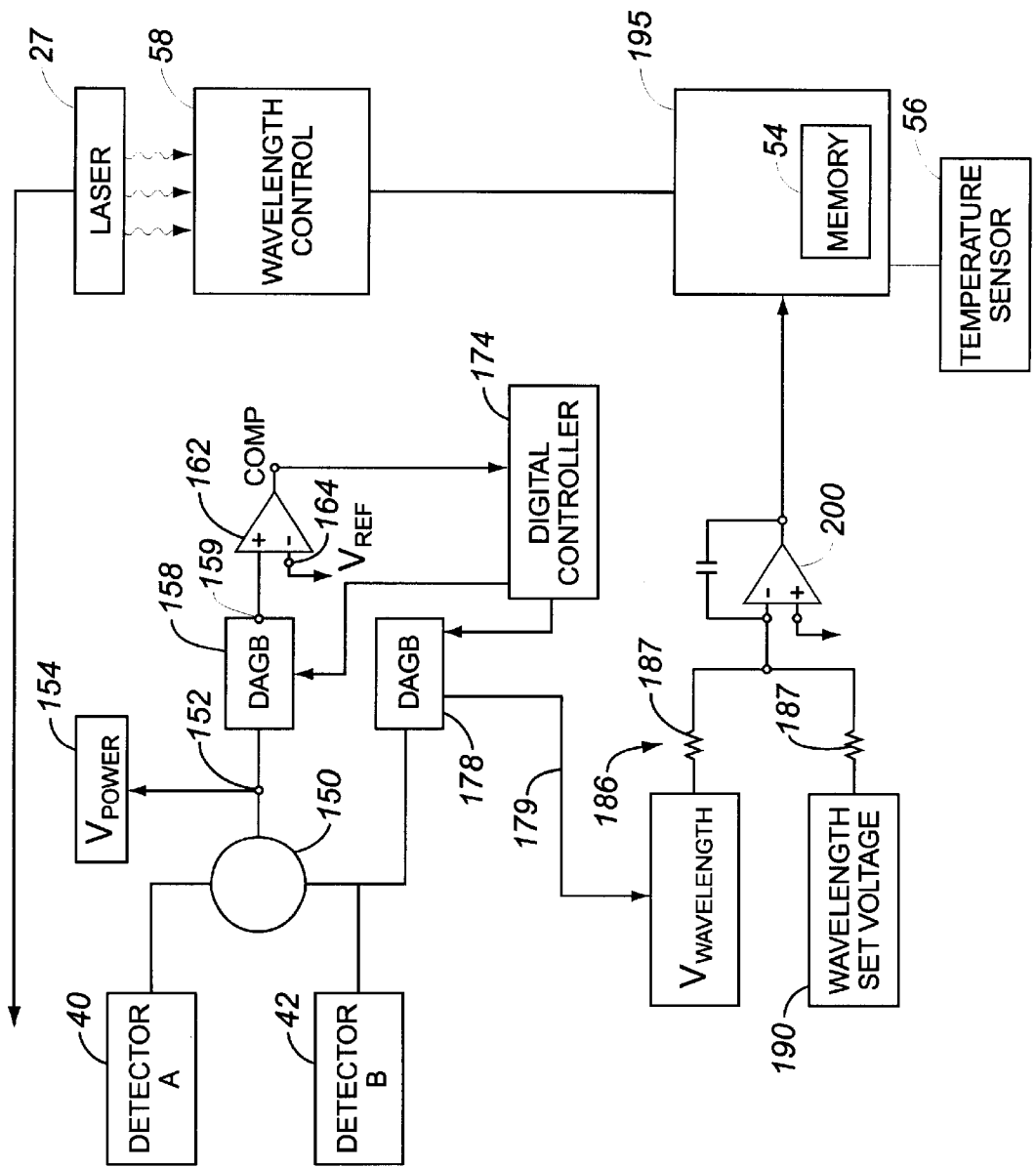
FIG. 7 illustrates an alternative embodiment of the error circuit of FIG. 1.

FIG. 7 illustrates an alternative embodiment of an error circuit 48. The error circuit of FIG. 7 ratios the detected signals to obtain the ratio A/(A+B), indicated by reference numeral 77 in FIG. 2C. The summer 150, which can be a simple two resistor network, sums the detected signals. One advantage of using the sum of the first and second detected signals in a ratio is that the voltage at point 152 is proportional to the total power being radiated by, for example, the laser 27 of FIG. 1, and can be made available, as indicated by reference number 154, for external use, such as in a leveling circuit for stabilizing the power output of a system laser 27.

The digital controller 174 senses the output of the comparator 162 to adjust the gain of the first digital-to-analog converter (DAC) 158 such that the output voltage 159 of the first DAC 158 supplied to the plus input of the comparator 162 is equal to a reference voltage Vref 164 provided to the negative input of the comparator 162. Accordingly, the gain of the first DAC 158, G1, multiplied by the sum of the first and second detected signals is equal to the voltage Vref.

Vref=(first detected signal+second detected signal)×G1

The digital controller 174 controls the second DAC 178 such that gain G2 of the second DAC 178 applied to the second detected signal is equal to the gain G1 of the first DAC 178. Thus G1=G2=Vref/(first detected signal+second detected signal)

and the voltage output 179 of the second DAC 178 is second detected signal×G1=(second detected signal×Vref)/(first detected signal+second detected signal)

A combiner 186, which can be a simple two resistor network including resistors 187, adds the output of the second DAC 178 to a set-point reference voltage (which is typically negative) provided by a set-point voltage reference supply 190 to provide the error signal to a control circuit 195 that is responsive to the temperature sensor 56 and includes a memory 54 for determining the temperature-corrected error signal for provision to the wavelength control 58.

In addition to the above-stated advantage of producing a signal 154 is that is proportional to the total power radiated by the laser 27, the ratio error circuit 28 of FIG. 7 is considered to have certain other advantages over differencing error circuits. The range over which the error signal varies is less affected by changes in the optical power of the of the laser 27, and hence of the first and second filtered beams 39 and 41. Thus the control of the laser 27 via the provision of the error signal to the wavelength control 58 is not as affected by variations in optical power. Furthermore, the first DAC 158 and the second DAC 178 can be matched and will typically perform repeatably for extended periods, thereby providing a stable wavelength set-point.

Regarding the generation of the error signal, one of ordinary skill in the art, in light of the disclosure herein, understands that the error signal can undergo additional processing before provision to the circuitry 195. Typically, such processing includes amplification and/or integration of the signal. An integrator 200 can be included for reducing residual error in the error signal that can otherwise be present when the wavelength of the laser 27 is close to the nominal wavelength and the error signal is small. A time constant of 5–10 seconds has been found to be acceptable. In the embodiment of the invention illustrated in FIGS. 3 and 5, the microcontroller 84 is programmed to digitally perform the integration of the error signal.

Returning to FIG. 7, the integrator 200 communicates the error signal to a processing subcircuit 195 that includes the memory 54 and is responsive to the temperature sensor 56 for providing the temperature-corrected error signal to the laser wavelength control 58. The subcircuit 195 need not be as powerful as the microcontroller 84 of FIGS. 3 and 5, as the functions of generating and integrating the error signal are already performed.

Figure 8:
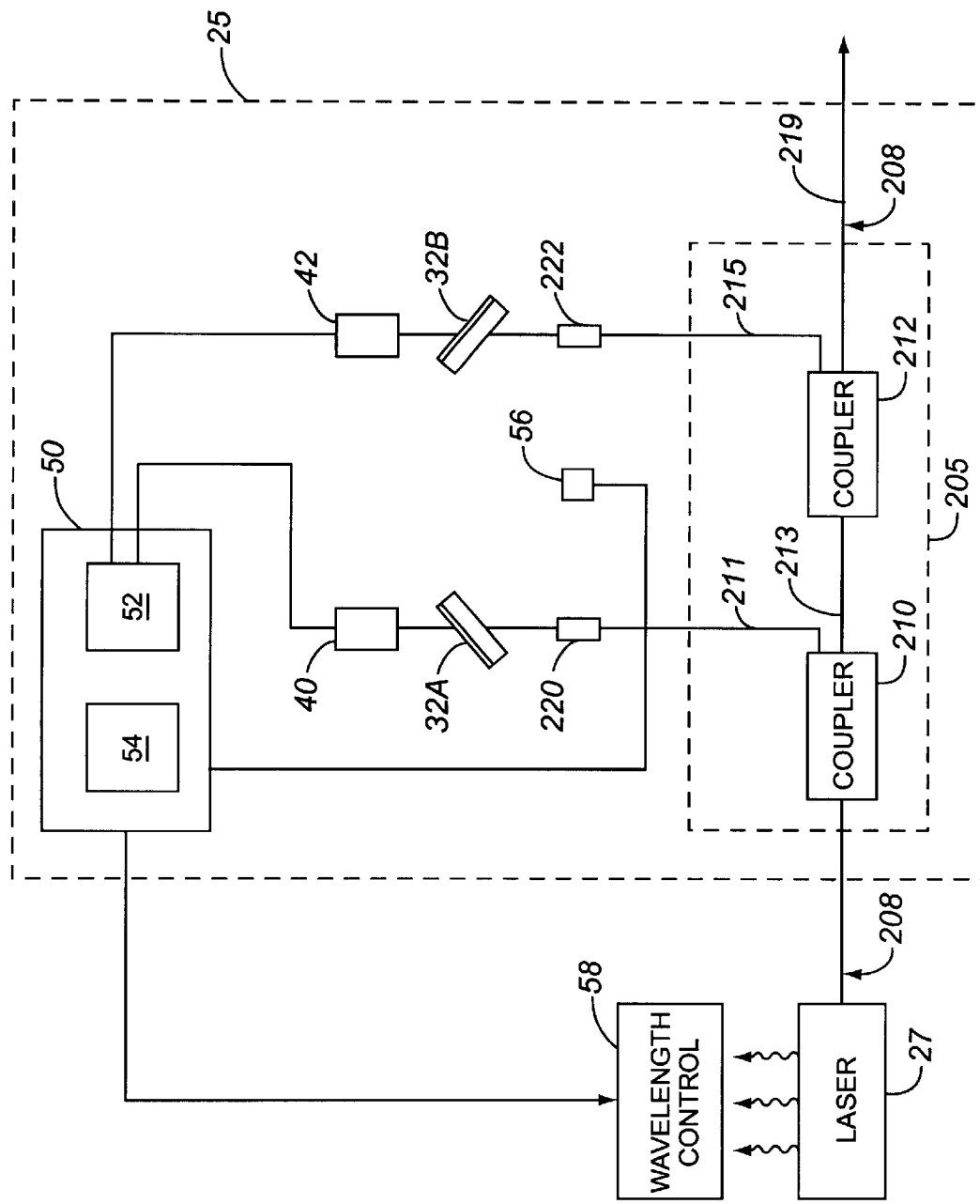
FIG. 8 illustrates an alternative embodiment of wavelength monitoring apparatus according to the present invention.

FIGS. 8–11 address alternative embodiments of wavelength monitoring apparatus 25 according to the present invention. As illustrated in FIG. 8, a beamsplitter apparatus 205 receives a beam propagating along an optical fiber 208. A first fiber optic coupler 210 of the beamsplitting apparatus splits off a first split beam to propagate along the fiber 211, and a second fiber optic coupler 212 receives the beam from the first optical fiber coupler 210 via an optical fiber 213 and splits off a second split to propagate along an optical fiber 215. The beam 208 exits the second optical fiber coupler 212 along the optical fiber 219.

Collimators 220 and 222 receive the first and second split beams and collimate the beams such that they are incident as free space beams on first and second optical filters, 32A and 32B, respectively. The first and second optical filters 32A and 32B filter the beams according to spectral filter functions, and the processing circuitry 50 processes detected signals from the optical detectors 40 and 42, in general as described in conjunction with FIG. 1 above.

Figure 9:
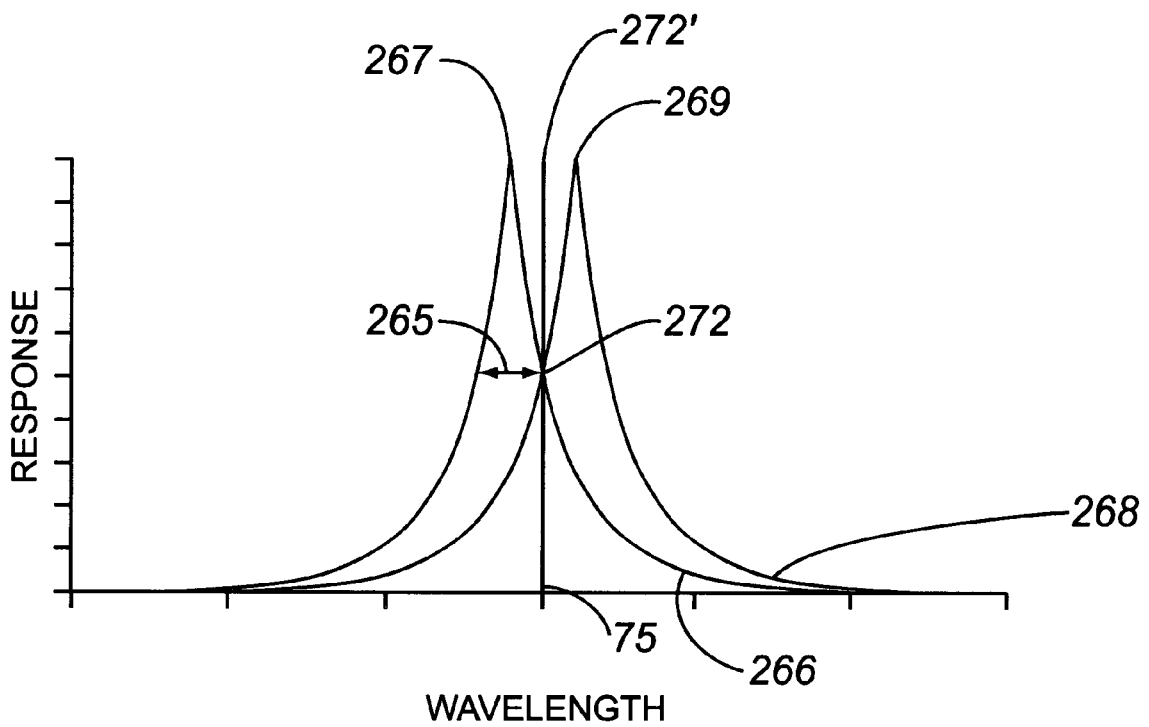
FIG. 9 illustrates the spectral filter functions according to which the optical filters of FIG. 8 produce filtered beams.
Figure 10:
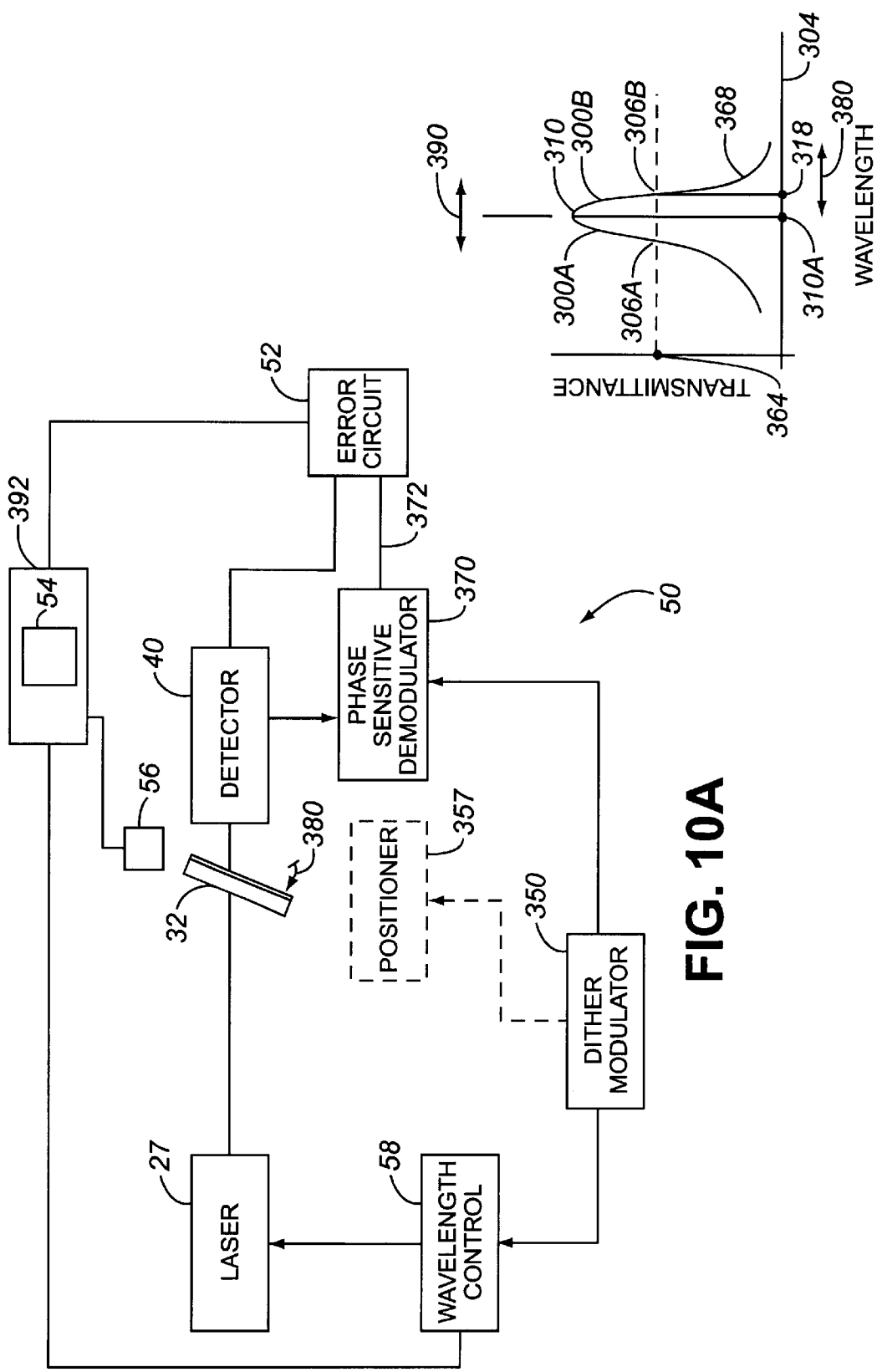
FIGS. 10A and 10B illustrate alternative embodiments of wavelength monitoring apparatus according to the invention.

FIG. 9 illustrates a first and second spectral filter functions (266 and 268, respectively, according to which the first and second optical filters, 32A and 32B, respectively, produce filtered beams. As with the spectral filter functions shown in FIG. 2, each spectral filter function in FIG. 9 can be characterized as having a bandwidth, such as the width 265 at half height for the first spectral filter function 266, and a resonant response, such as the resonant response 267 for the first spectral filter function 266 and the resonant response 269 for the second spectral filter function 268. The first and second spectral filter functions differ primarily from each other in that the wavelengths corresponding to the resonant response for each spectral filter function are shifted from each other.

The first and second split beams are incident on the filters 32A and 32B at selected angles of incidence. As understood by one of ordinary skill, in light of disclosure herein, the spectral filter function of a given filter is a function of the substrate, the filter layer, and the angle of incidence the optical beam. Varying the angle of incidence of a beam on a filter primarily shifts the wavelength corresponding to the resonant response of the spectral filter function. Thus the first and second filters 40 and 42 can be substantially physically identical, yet have the spectral filter functions 266 and 268, selected such that an error function responsive to the deviation of the wavelength of the laser from a selected nominal wavelength can be determine from a comparison of the filtered beams, because the filters are disposed selected angles to the respective beams incident thereon. Disposing the first or second, or both, filters at an angle to an incident beam to vary the spectral filter function of the filter is referred to herein as angle tuning, and can have significant benefits. For example, a 16 channel laser communication system having 16 laser sources, each operating at a different wavelength, can require 32 distinct spectral filter functions, (2 per laser wavelength, as in FIG. 8), and hence, in typical prior art systems, up to 32 physically distinct filters (e.g. filters having different filter layers, thickness thereof and/or substrates) to provide 32 different spectral filter functions for wavelength monitoring and control of all the channels. However, using angle tuning according to the invention to vary the spectral filter function of the filters, such a laser system may require as few as 3 or 4 physically distinct filters to obtain the 32 distinct spectral filter functions. Similar considerations apply to the embodiment of the invention shown in FIG. 1, in which a single optical filter 32 provides both first and second spectral filter functions. The filters 32A and 32B are typically angle tuned such that they cross at a selected crossing point 272 corresponding to a crossing point wavelength 272.

Note that in the embodiment of the invention shown in FIG. 1, a single optical filter 32 reflects and transmits filtered beams for comparison to determine the error function, whereas in the embodiment shown above in FIG. 8, two separate filters transmit the filtered beams. It is also possible to use two filters to reflect both filtered beams, or to use one filter to transmit and another to reflect first and second filtered beams, respectively.

FIGS. 10A and 10B illustrate an embodiment of the wavelength monitoring apparatus 25 that can use one optical filter 32 and one optical detector 40. FIG. 10B shows the spectral filter function 368 for the optical filter 32, which may or may not be angle tuned. A nominal wavelength 318 can correspond to the point 306B of the spectral filter function 366. However, because the spectral filter function 368 is equal at the points 306A and 306B, it is important to ensure that the beam filtered by the optical filter 32 does indeed have a wavelength corresponding to negative slope 306B of the spectral filter function 366 rather than the positive slope 306A. A dither modulator 350 can communicate with the laser wavelength control 58 or with the positioner 357, which can be a piezoelectric transducer or a stepper motor, to impart a dither 380 in the wavelength or a dither 390 in the spectral filter function, respectively. On the positive slope 306A, the intensity of the filtered beam 364 will change in phase with the dither; on the negative slope 306B it will change out of phase with the dither. Accordingly, a phase sensitive modulator 370 communicates with the dither modulator 350 to demodulate the detected signal for communicating with the error circuit 52, as indicated by reference numeral 372, to ensure operation on the negative positive slope 306B (i.e., in the proper tuning range) or to inform the error circuit 52 of which slope to use in determining the error signal. The error circuit 52 includes an offset provision to account for the non zero detected signal 364 when the wavelength of the beam is equal to the nominal wavelength 318. The processing circuitry 50 includes a processing element 392 for applying the offset values stored in memory 54 to the uncorrected error signal produced by the error circuit 52 to provide a temperature-corrected error signal to the wavelength control 58.

Figure 11:
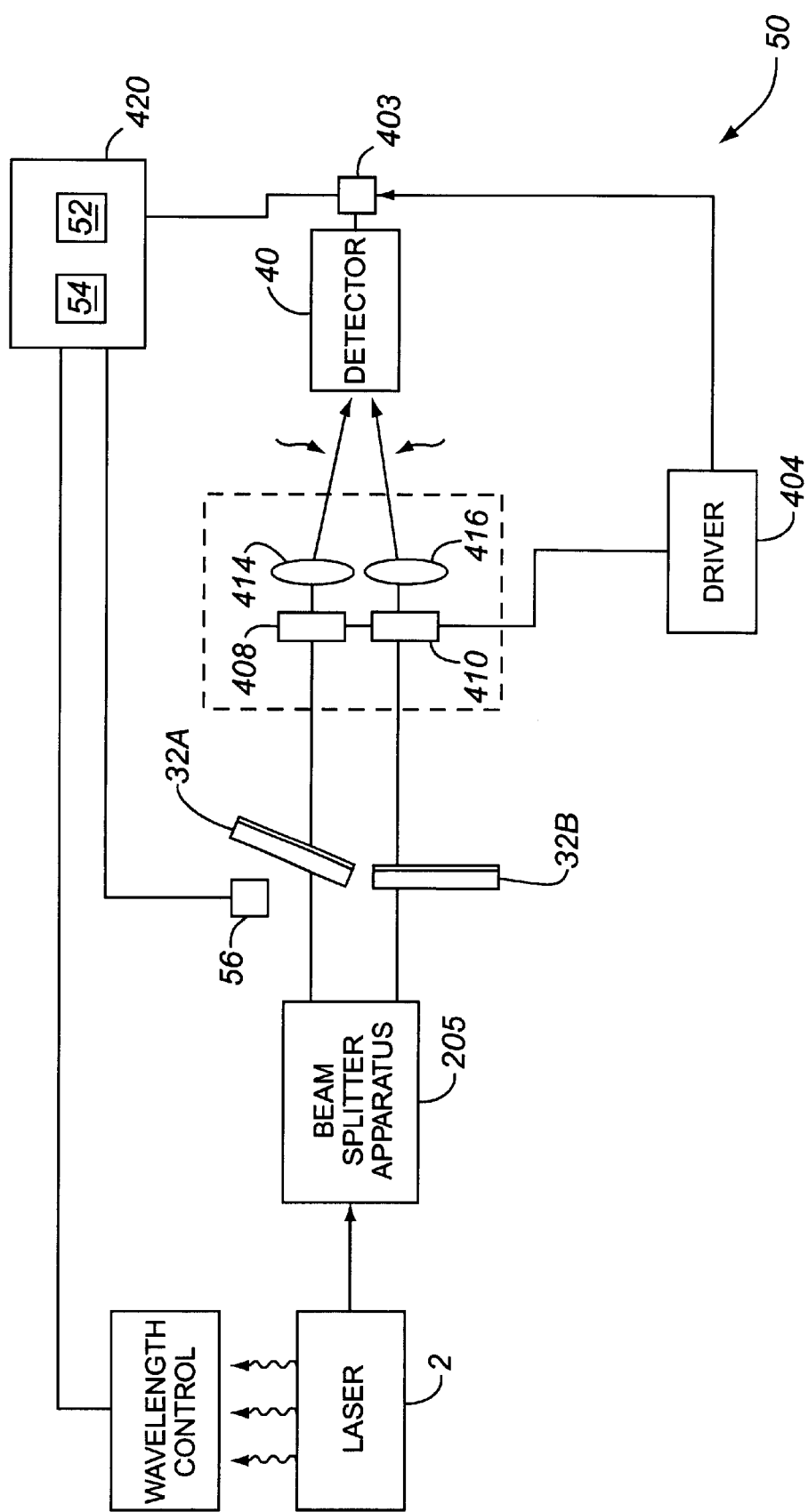
FIG. 11 illustrates an additional alternative embodiment of wavelength monitoring apparatus according to the present invention.

FIG. 11 illustrates a laser system including wavelength monitoring apparatus wherein the first and second filtered beams produced by the optical filters 32A and 32B are time division multiplexed onto an optical detector 40. A switch driver 404 drives optical switches 408 and 410 for alternately switching first and second filtered beams, produced by the first and second optical filters 32A and 32B, respectively, to the optical detector 40. Optics elements 414 and 416 direct the first and second filtered beams, when passed by the switches 410 and 408, to the optical detector 40. The driver 404 communicates with a switch 403 for inverting the first detected signal communicated from the optical detector 40 to the filter 420 when the optical switch 410 directs the first filtered beam to the optical detector 40. Accordingly, the error circuit 52 is in this instance a filter, and provides an output error signal that is subsequently temperature-corrected by processing element 420 acting to apply the offset values stored in the memory 54 to the uncorrected error signal. The duty cycle of the switch driver 404 can be varied for varying the nominal wavelength.

Figure 12A:
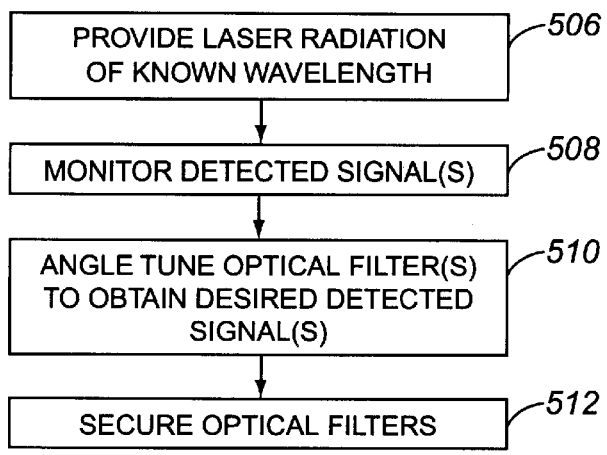
FIGS. 12A–12B illustrates a flow chart of methods for calibrating and operating the wavelength monitoring apparatus of the present invention and laser apparatus incorporating such wavelength monitoring apparatus.
Figure 12B:
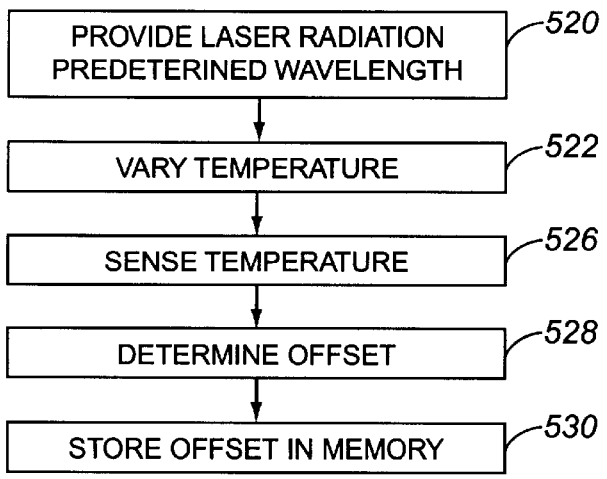

FIGS. 12A–12B illustrates a flow chart of methods for calibrating and operating the wavelength monitoring apparatus of the present invention and laser apparatus incorporating such wavelength monitoring apparatus.

FIG. 12A generally delineates steps in preparing a wavelength monitoring apparatus 25 to monitor a selected wavelength. With reference to the apparatus shown in FIG. 8 as an example, laser radiation having a known wavelength is provided to the beam splitting apparatus 205, as indicated by block 506, and the outputs of the optical detectors measured, as in block 508. (Alternatively, an error signal produced by the processing circuitry can be monitored). The optical filter(s) are then angle tuned (i.e. the angle of incidence of the beams on the filter(s) is varied, typically by moving the filter(s)) to obtain a desired output from the optical detectors, shown in 510. For example, the optical filters 32 can be angle tuned such that the spectral filter functions 266 and 268 in FIG. 9 cross at the known wavelength, that is, the output of the optical detectors is equal at the known wavelength. The known wavelength can have been selected to correspond to the nominal wavelength such that the optical detectors have equal output at the nominal wavelength, from which the error signals represent the deviation of the wavelength of monitored laser radiation. Proceeding to block 512, the optical filters are secured such that the optical filters maintain the selected angles of incidence laser radiation incident upon them. Preferably, the optical filters 32 are laser welded to the substrate on which they are mounted.

With reference to FIG. 12B, there is a provided a series of steps for calibrating the wavelength monitoring apparatus provide a temperature-corrected error signal. Again with reference to the embodiment of FIG. 8 as an example, laser radiation of a predetermined wavelength is provided to the beamsplitter apparatus 205, as indicated by reference numeral 520. The predetermined wavelength, can be, though need not be, equal to the known wavelength used in the steps of FIG. 12A. The temperature of at least the optical beamsplitter apparatus 205 and the optical filters 32 is then varied, as indicated by reference numeral 522. If the wavelength monitoring apparatus includes all the components associated with reference numeral 25 housed within a single module or on a single substrate, the temperatures of the entire apparatus 25 can be varied, such as by placing the wavelength monitoring apparatus in an oven having appropriate temperature control. Proceeding to block 526, the temperature is sensed with the temperature sensor 56, and, as indicated in block 528, the offset value determined. The offset typically simply corresponds to the uncorrected error signal determined by the error circuit 52. As shown in block 530, the offset value is stored in a memory location corresponding to the temperature sensed by the sensor 56. The steps shown in FIG. 12B are then repeated until an offset table spanning the desired temperature range, and having an appropriate number of entries, is stored in the memory 54. The processing circuitry can include provision for self calibration, that is, sensing the temperature and storing an offset value when the temperature has changed by a predetermined amount. as indicated by the calibration loops indicated by reference numerals 83A and 83B in FIG. 3. As indicated by the reference numeral 83B, the microcontroller can include provision for performing the self-calibration within the microcontroller chip.

Figure 12C:
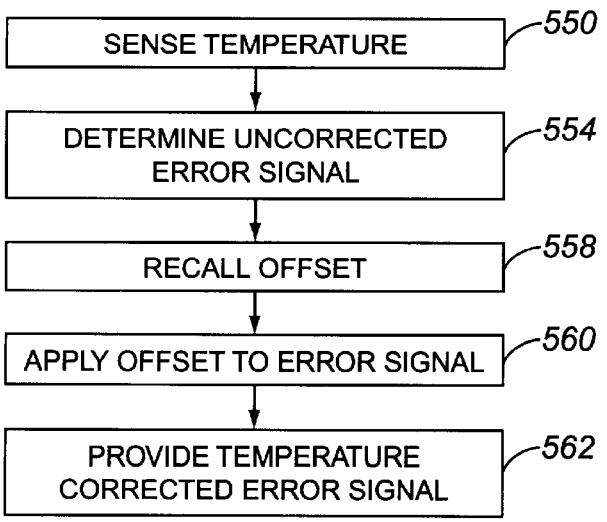

FIG. 12C indicates operation of the wavelength monitoring apparatus of the present invention to provide a temperature calibrated error signal. The temperature sensor 56 provides an indication of temperature, as indicated by reference numeral 550, and the error circuit 52 determines the uncorrected error signal, as shown in block 554. Proceeding to block 558, the processing circuitry recalls the appropriate offset value(s) corresponding to the temperature sensed in block 550, and as indicate by blocks 560 and 562, the offset value(s) is (are) applied to the error signal to provide a temperature-corrected error signal. If the temperature sensed in block 550 does not correspond to a temperature for which an offset value is stored, the processing circuitry 50 can interpolate, as is known in the art.

Figure 13:
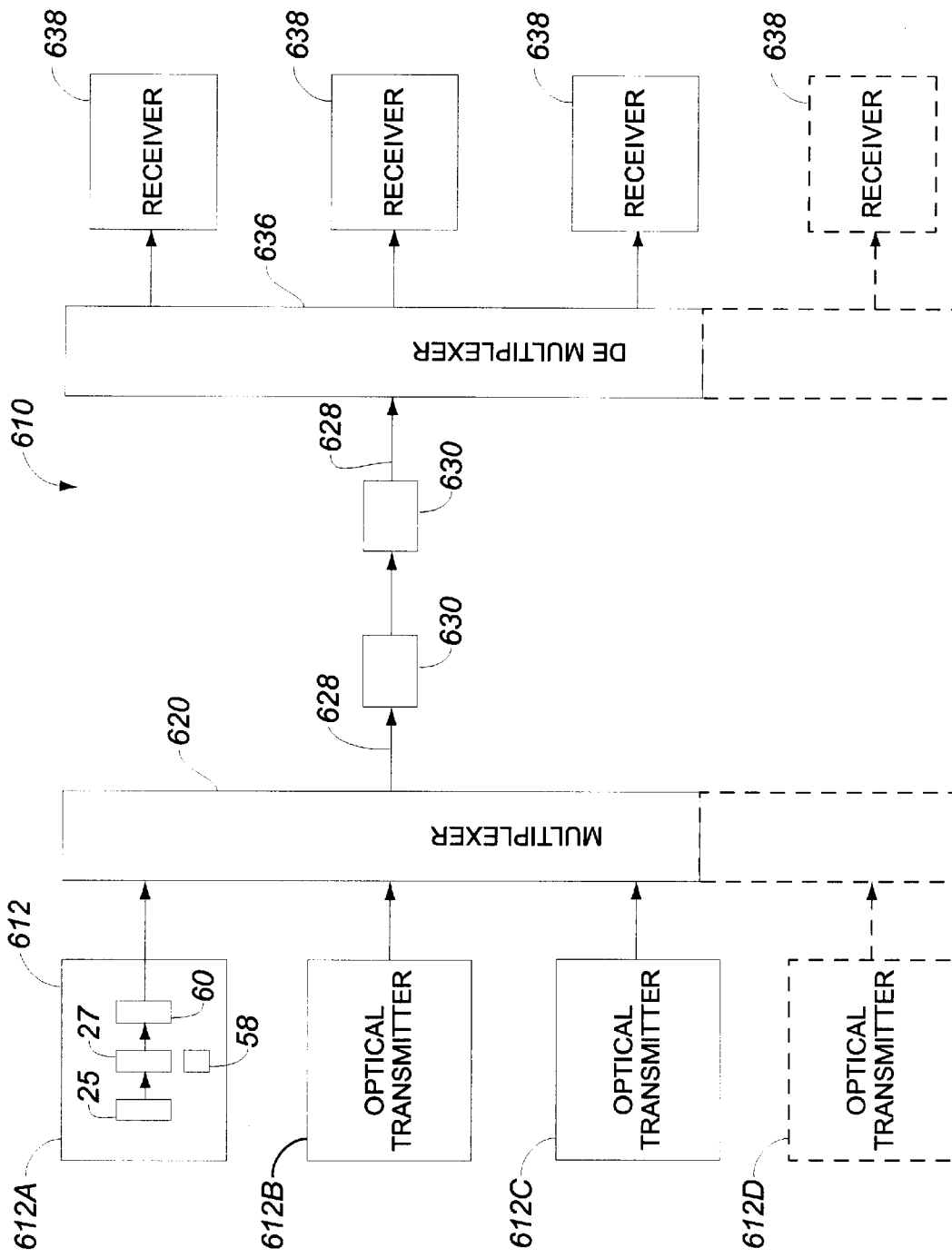
FIG. 13 illustrates a block diagram of a DWDM optical communication system including optical transmitters incorporating wavelength monitoring apparatus according to the invention and also including a wavelength control for regulating the wavelength of the laser radiation of each optical transmitter.

FIG. 13 illustrates generally a block diagram of a DWDM optical communication system 610 including optical transmitters 612 incorporating wavelength monitoring apparatus 25 according to the invention and also including a wavelength control 58 for regulating the wavelength of the laser radiation of each optical transmitter 612. Each of optical transmitters 612 operates at a different wavelength, and the multiplexer 620 combines the outputs of the optical transmitters 612A–D for propagation along the optical fiber link 628. Fiber amplifiers 630 disposed at appropriate interval along the fiber optic link 628 maintain the signal strength of the various wavelengths. The demultiplexer 636 directs the radiation at the appropriate wavelengths to the proper receivers 638A–D. Each transmitter 612A–D uses the wavelength monitoring apparatus 25. The embodiment of the invention shown in FIG. 1 is preferred as it need not use a beamsplitter. Also mounting of the optical detectors 40 and 42 on the optical filter 32 provides a compact and more temperature stable design, as the filter 32 and optical detectors 40 and 42 are in thermal communication, reducing any temperature gradients, and allowing the more accurate temperature sensing by the sensor 56. Furthermore, the optical filter 32 and optical detectors 40 and 42 can be mounted in a common package with the laser 27 and if desired, in thermal communication with the laser 27, for more accurate stability and temperature control of the overall optical transmitter 612A. The laser 27, wavelength control 58, and wavelength monitoring apparatus can all be mounted within a single package, along with the modulator 60.

It will thus be seen that the invention efficiently attains the objects set forth above, among those made apparent from the preceding description. Because certain changes may be made in the above constructions without departing from the scope of the invention, it is intended that all matter presented in the above description or shown in the accompanying drawings be interpreted as illustrative and not as limiting. For example, as understood by one of ordinary skill in the art, in light of the disclosure herein, many techniques and circuits described above in conjunction with the use of two optical filters are also suitable for use with a single filter, such as the filter 32 shown in FIG. 1, that transmits and reflects the first and second filtered beams, respectively, and such variations are considered within the scope of the invention. As one example, proper routing of filtered beams can allow use of a single optical detector with optical filter 32.

It is also understood that the following claims are to cover all generic and specific features of the invention described herein, and all statements of the scope of the invention which as a matter of language, might be said to fall therebetween.

Having described the invention, what is claimed as new and secured by Letters Patent is:

1. An apparatus for monitoring the wavelength of laser radiation, comprising:
    an optical filter for receiving at least a portion of the laser radiation and for transmitting a first filtered beam in accordance with a first spectral filter function and for reflecting a second filtered beam in accordance with a second spectral filter function, said spectral filter functions crossing at least one crossing wavelength;
    first and second optical detectors for receiving said first and second filtered beams, respectively, and for providing first and second detected signals;
    a temperature sensor for sensing a temperature charateristic of at least said optical filter; and
    processing circuitry for providing a temperature-corrected error signal responsive to the deviation of the wavelength of the laser radiation from a nominal wavelength, said processing circuitry including
        an error circuit for providing, responsive to said first and second detected signals, an uncorrected error signal responsive to the deviation of the wavelength of the laser radiation from the nominal wavelength; and
        a memory for providing offset values corresponding to selected temperatures, and wherein said processing circuitry, responsive to said temperature sensor, modifies said uncorrected error signal based on at least one offset value to produce said temperature-corrected output signal.

2. The apparatus of claim 1 wherein said optical filter mounts said first and second optical detectors.

3. The apparatus of claim 1 wherein said processing circuitry includes a microcontroller chip that includes on the chip said memory and said error circuit, said memory including a PROM circuit.

4. The apparatus of claim 3 wherein said microcontroller is programmed such that the determination of said error signal by said error circuit includes determining a ratio of the difference between said detected signals to the sum of said detected signals.

5. The apparatus of claim 3 wherein said microcontroller is programmed for providing self calibration for determining and storing said offset values in said memory, said self calibration including determining, at selected temperatures, the deviation of said uncorrected error signal from a predetermined value and storing an offset responsive to said deviation and associating the stored offset with one of the selected temperatures.

6. The apparatus of claim 3 further including an analog to digital converter for converting said detected signals from analog to digital from for provision to said microcontroller and a digital to analog converter for receiving a digital temperature-corrected error signal from said microcontroller and converting said digital signal to analog form.

7. Apparatus for monitoring the wavelength of laser radiation, comprising:
    at least one optical filter for filtering said laser radiation according to at least one spectral filter function to produce filtered laser radiation;
    at least one optical detector for detecting said filtered laser radiation to produce a first detected signal;
    a temperature sensor for sensing a temperature characteristic of at least said optical filter; and
    processing circuitry for providing a temperature-corrected error signal responsive to the deviation of the wavelength of the laser radiation from a nominal wavelength, said processing circuitry including
        an error circuit for providing, responsive to at least said first detected signal, an uncorrected signal responsive the deviation of the wavelength of the laser radiation from the nominal wavelength; and
        a memory for providing offset values corresponding to selected temperatures, and wherein said processing circuitry, responsive to said temperature sensor, modifies said uncorrected signal based on at least one offset value to produce said temperature-corrected error signal.

8. The apparatus of claim 7 wherein said processing circuitry includes a microcontroller chip that includes on the chip said memory and said error circuit, said memory including a PROM circuit.

9. The apparatus of claim 8 further including a digital to analog converter for receiving a digital temperature-corrected error signal from said microcontroller and converting said digital signal to analog form.

10. The apparatus of claim 9 including wherein said memory includes an EEPROM.

11. The apparatus of claim 8 wherein said memory stores each offset value in a corresponding address, and wherein said microcontroller includes a means for associating each address with a selected temperature.

12. The apparatus of claim 8 wherein said wavelength monitoring apparatus includes first and second photodetectors for detecting first and second filtered beams and wherein said microcontroller is programmed such that the determination of said error signal by said error circuit includes determining a ratio of the difference between said detected signals to the sum of said detected signals.

13. The apparatus of claim 7 wherein said microcontroller is programmed for providing self calibration for determining and storing said offset values in said memory, said self calibration including determining, at selected temperatures, the deviation of said uncorrected error signal from a predetermined value and storing an offset responsive to said deviation and associated the stored offset with one of the selected temperatures.

14. The apparatus of claim 7 wherein said processing circuit includes a self calibration means for determining and storing said offset values in said memory, said self calibration means determining, at each of selected temperatures, the deviation of said uncorrected error signal from a predetermined value and storing said deviation as an offset value associated with one of said selected temperatures.

15. The apparatus of claim 7 wherein said wavelength monitoring apparatus includes first and second photodetectors for detecting first and second filtered beams, and wherein said error circuit includes:
   a summing circuit for summing the first and second detected signals to produce a summed signal;
   a first circuit means for determining a first ratio of a first reference voltage to said summed signal; and
   a second circuit means responsive to said first circuit means for multiplying said second signal by a factor substantially equal to said first ratio to produce an output signal representative of a ratio of said second signal divided by the sum of said first and second signals.

16. The apparatus of claim 7 including:
   an optical beam splitting apparatus for splitting first and second split beams from a beam of the laser radiation, and including first and second optical filters for receiving said split beams and for filtering said beams according to first and second spectral filter functions.

17. The apparatus of claim 7 wherein said apparatus is adapted for operating said at least one optical detector in an unbiased transimpedance mode.

18. A laser apparatus, comprising:
   a laser for producing laser radiation having a selected wavelength;
   at least one optical filter for filtering said laser radiation according to at least one spectral filter function to produce filtered laser radiation;
   a least one optical detector for detecting said filtered laser radiation to produce a first detected signal;
   a temperature sensor for sensing a temperature characteristic of at least said optical filter; and
   processing circuitry for providing a temperature-corrected output signal responsive to the deviation of the wavelength of the laser radiation from a nominal wavelength, said processing circuitry including
      an error circuit for providing, responsive to at least said first detected signal, an uncorrected signal responsive the deviation of the wavelength of the laser radiation from the nominal wavelength; and
      a memory for providing offset values corresponding to selected temperatures, and wherein said processing circuitry, responsive to said temperature sensor, modifies said uncorrected signal based on at least one offset value to produce said temperature-corrected output signal;
   a laser wavelength control in electrical communication with said processing circuitry for controlling the wavelength of radiation of said laser responsive to said temperature-corrected error signal.

19. The apparatus of claim 18 wherein said laser wavelength control includes a thermoelectric cooler for controlling the temperature of said laser responsive to said temperature-corrected error signal.

20. The apparatus of claim 18 wherein said laser wavelength control at least one of a current and a voltage provided to said laser responsive to said temperature-corrected error signal.

21. The apparatus of claim 18 including an optical filter disposed for receiving at least a portion of said radiation and for reflecting a first beam filtered according to a first filter function and transmitting a second beam according to a second filter function; and
   first and second optical detectors disposed for receiving said first and second filtered beams, respectively, and for providing first and second detected signals.

22. Apparatus for monitoring the wavelength of laser radiation, comprising:
   means for sampling the laser radiation for providing at least a first detected signal responsive to the wavelength of the laser radiation, said means for sampling including
      an optical filter means for filtering the laser radiation according to at least one spectral filter function to provide a beam filtered according to the spectral filter function;
      an optical detector means for detecting said beam filtered according to the spectral filter function to provide said first detected signal;
   temperature sensing means for providing a signal characteristic of at least said optical filter means; and
   processing circuit means for providing a temperature-corrected signal responsive to the deviation of the wavelength of the laser radiation responsive to at least said temperature responsive signal, temperature correction data, and an uncorrected signal responsive to the deviation or the wavelength of the laser radiation from the nominal wavelength, said control circuit means including
      error circuit means for providing said uncorrected error signal; and
      memory means for storing said temperature correction data.

23. The apparatus of claim 22 wherein said error circuit means and said memory means residing on a single semiconductor chip that is part of a module including said optical detector means and said optical filter means.

24. A method of calibrating a calibrated wavelength monitoring apparatus, the wavelength monitoring apparatus including at least one optical filter, at least one optical detector, a temperature sensor and processing circuitry including a memory and an error circuit, the method comprising:
   directing a beam of a known wavelength of laser radiation to the optical filter such that the optical detector detects filtered radiation;

angle tuning said optical filter such that said optical detector provides a selected detected signal determining the temperature sensed by said temperature sensor;

determining the uncorrected output signal provided by the error circuit;

storing an offset value representative of said uncorrected output signal in a location of the memory and associating offset value with a temperature; and varying the temperature and repeating the previous three steps to provide said memory with a selected number of offset values associated with a selected number of different temperatures for modifying the uncorrected signal provided by the error circuit during operation of the wavelength monitor to provide a temperature-corrected output signal representative of the deviation of the wavelength of the laser radiation from a nominal wavelength.

25. A method of operating a laser apparatus for regulating the wavelength of the laser radiation, comprising:

operating a laser to provide a laser beam;

filtering at least a first portion of the laser beam with an optical filter to produce at least one filtered beam in accordance with a spectral filter function detecting the filtered beam with a photodetector to produce a detected signal;

processing the detected signal to produce an uncorrected error signal responsive to the deviation of the wavelength of the laser beam to a nominal wavelength;

sensing a temperature characteristic of at least the optical filter;

responsive to the temperature of the filter using at least one offset value associated with predetermined temperature to correct the uncorrected error signal to provide a temperature-corrected error signal;

providing the temperature-corrected error signal to a wavelength control for controlling the wavelength of the laser radiation.

* * * * *

UNITED STATES PATENT AND TRADEMARK OFFICE
CERTIFICATE OF CORRECTION

PATENT NO.    : 6,353,623 B1
DATED         : March 5, 2002
INVENTOR(S)   : Munks et al.

It is certified that error appears in the above-identified patent and that said Letters Patent is hereby corrected as shown below:

Column 11,
Line 11, "366" should read -- 368 --
Line 28, "negative positive" should read -- negative --

Signed and Sealed this

Nineteenth Day of November, 2002

Attest:

JAMES E. ROGAN
Attesting Officer  Director of the United States Patent and Trademark Office